(12) United States Patent
Wang et al.

(10) Patent No.: US 12,229,341 B2
(45) Date of Patent: Feb. 18, 2025

(54) FINGER-MOUNTED INPUT DEVICES

(71) Applicant: Apple Inc., Cupertino, CA (US)

(72) Inventors: Paul X. Wang, Cupertino, CA (US);
Tim H. Cornelissen, Mountain View, CA (US); Richard G. Huizar, Sunnyvale, CA (US); Paul V. Johnson, San Francisco, CA (US)

( * ) Notice: Subject to any disclaimer, the term of this patent is extended or adjusted under 35 U.S.C. 154(b) by 407 days.

(21) Appl. No.: 16/926,561

(22) Filed: Jul. 10, 2020

(65) Prior Publication Data

US 2021/0089131 A1 Mar. 25, 2021

Related U.S. Application Data

(60) Provisional application No. 62/904,547, filed on Sep. 23, 2019.

(51) Int. Cl.
*G06F 3/01* (2006.01)
*G06F 1/16* (2006.01)
(Continued)

(52) U.S. Cl.
CPC ............... *G06F 3/017* (2013.01); *G06F 1/163* (2013.01); *G06F 3/013* (2013.01); *G06F 3/016* (2013.01);
(Continued)

(58) Field of Classification Search
CPC ....... G06F 3/017; G06F 3/04883; G06F 1/163
See application file for complete search history.

(56) References Cited

U.S. PATENT DOCUMENTS 5,581,484 A 12/1996 Prince
5,631,861 A 5/1997 Kramer
(Continued)

FOREIGN PATENT DOCUMENTS

CN 102023731 A 4/2011
CN 103109462 A 5/2013
(Continued)

OTHER PUBLICATIONS

Hutson, Finger devices let users 'touch' virtual objects, Science, AAAS, Apr. 25, 2017, 4 pages.
(Continued)

*Primary Examiner* — William Boddie
*Assistant Examiner* — Alecia D English
(74) *Attorney, Agent, or Firm* — Treyz Law Group, P.C.; Kendall P. Woodruff

(57) ABSTRACT

A system may include an electronic device and one or more finger devices. The electronic device may have a display and the user may provide finger input to the finger device to control the display. The finger input may include pinching, tapping, rotating, swiping, pressing, and/or other finger gestures that are detected using sensors in the finger device. The sensor data related to finger movement may be combined with user gaze information to control items on the display. The user may turn any surface or region of space into an input region by first defining boundaries of the input region using the finger device. Other finger gestures such as pinching and pulling, pinching and rotating, swiping, and tapping may be used to navigate a menu on a display, to scroll through a document, to manipulate computer-aided designs, and to provide other input to a display.

9 Claims, 9 Drawing Sheets

(51) Int. Cl.
  *G06F 3/03* (2006.01)
  *G06F 30/00* (2020.01)
(52) U.S. Cl.
  CPC ............ *G06F 3/0304* (2013.01); *G06F 30/00* (2020.01); *G06F 2203/0331* (2013.01)

(56) References Cited

U.S. PATENT DOCUMENTS

| | | | |
|---|---|---|---|
| 6,129,004 | A | 10/2000 | McDowall et al. |
| 6,313,825 | B1 | 11/2001 | Gilbert |
| 6,388,247 | B2 | 5/2002 | Asada et al. |
| 8,086,971 | B2 | 12/2011 | Radivojevic et al. |
| 8,368,641 | B2 | 2/2013 | Tremblay et al. |
| 8,610,548 | B1 | 12/2013 | Provancher |
| 8,724,861 | B1 | 5/2014 | Sun |
| 8,994,827 | B2 | 3/2015 | Mistry et al. |
| 9,104,271 | B1 | 8/2015 | Adams et al. |
| 9,110,505 | B2 | 8/2015 | Mastandrea |
| 9,711,060 | B1 | 7/2017 | Lusted et al. |
| 9,798,388 | B1 * | 10/2017 | Murali ................. G06F 3/0487 |
| 10,139,906 | B1 * | 11/2018 | Bai ......................... G06F 3/014 |
| 2001/0025917 | A1 * | 10/2001 | Asada .................... G01L 5/226 250/221 |
| 2003/0025721 | A1 * | 2/2003 | Clapper ................ G06F 3/0426 715/700 |
| 2003/0142065 | A1 * | 7/2003 | Pahlavan .............. G06F 3/0346 345/156 |
| 2003/0214481 | A1 | 11/2003 | Xiong |
| 2004/0012559 | A1 * | 1/2004 | Seki ...................... G06F 3/0346 345/156 |
| 2004/0210166 | A1 | 10/2004 | Soh et al. |
| 2005/0052412 | A1 | 3/2005 | McRae et al. |
| 2006/0103634 | A1 | 6/2006 | Kim et al. |
| 2007/0030246 | A1 | 2/2007 | Tremblay et al. |
| 2009/0096746 | A1 * | 4/2009 | Kruse ...................... G06F 3/017 345/156 |
| 2009/0153365 | A1 | 6/2009 | Salsedo et al. |
| 2009/0153477 | A1 | 6/2009 | Saenz |
| 2009/0278798 | A1 * | 11/2009 | Kim ......................... G06F 3/017 345/158 |
| 2009/0287898 | A1 | 11/2009 | Kim et al. |
| 2010/0103106 | A1 | 4/2010 | Chui |
| 2010/0219989 | A1 * | 9/2010 | Asami ..................... G06F 3/014 341/20 |
| 2010/0231505 | A1 | 9/2010 | Iwata |
| 2011/0210931 | A1 | 9/2011 | Shai |
| 2011/0213664 | A1 | 9/2011 | Osterhout et al. |
| 2012/0249419 | A1 | 10/2012 | Bronner et al. |
| 2012/0293434 | A1 * | 11/2012 | Duffield .............. G06F 3/04883 345/173 |
| 2013/0021269 | A1 * | 1/2013 | Johnson .................. G06F 3/011 345/173 |
| 2013/0151960 | A1 | 6/2013 | Wiertlewski et al. |
| 2013/0162415 | A1 | 6/2013 | Kim et al. |
| 2013/0257750 | A1 | 10/2013 | Nicholson et al. |
| 2013/0283213 | A1 * | 10/2013 | Guendelman ......... G06F 3/0485 715/848 |
| 2014/0063060 | A1 | 3/2014 | Maciocci et al. |
| 2014/0176439 | A1 * | 6/2014 | Keller .................... G06F 3/0233 345/159 |
| 2014/0361988 | A1 | 12/2014 | Katz et al. |
| 2014/0368434 | A1 | 12/2014 | Paek et al. |
| 2015/0205417 | A1 | 7/2015 | Yairi et al. |
| 2015/0248160 | A2 | 9/2015 | Provancher et al. |
| 2015/0269783 | A1 * | 9/2015 | Yun ........................ G06F 3/0304 345/633 |
| 2015/0277559 | A1 | 10/2015 | Vescovi et al. |
| 2015/0339899 | A1 * | 11/2015 | Ozaki et al. |
| 2016/0034742 | A1 * | 2/2016 | Kim ....................... G06F 21/35 382/124 |
| 2016/0058375 | A1 | 3/2016 | Rothkopf |
| 2016/0187974 | A1 | 6/2016 | Mallinson |
| 2016/0287165 | A1 | 10/2016 | Abreu |
| 2016/0295989 | A1 | 10/2016 | Hakeem et al. |
| 2016/0313798 | A1 | 10/2016 | Connor |
| 2017/0003762 | A1 | 1/2017 | Ishii et al. |
| 2017/0045948 | A1 | 2/2017 | Nattukallingal |
| 2017/0090666 | A1 | 3/2017 | Pahud et al. |
| 2017/0143087 | A1 | 5/2017 | Cunningham |
| 2017/0188947 | A1 | 7/2017 | Connor |
| 2017/0192493 | A1 | 7/2017 | Ofek et al. |
| 2017/0212552 | A1 | 7/2017 | Stotler |
| 2017/0235332 | A1 | 8/2017 | Von Badinski et al. |
| 2017/0277367 | A1 | 9/2017 | Pahud et al. |
| 2017/0296363 | A1 | 10/2017 | Yetkin et al. |
| 2017/0330471 | A1 | 11/2017 | Subiakto |
| 2017/0351345 | A1 * | 12/2017 | Nirjon ..................... G06F 3/014 |
| 2017/0357320 | A1 | 12/2017 | Chaudhri et al. |
| 2017/0367590 | A1 | 12/2017 | Sebe et al. |
| 2018/0286189 | A1 | 10/2018 | Motamedi et al. |
| 2018/0342229 | A1 * | 11/2018 | Yan ........................ G10H 1/344 |
| 2019/0004604 | A1 | 1/2019 | Wang et al. |

FOREIGN PATENT DOCUMENTS

| | | |
|---|---|---|
| CN | 103677272 A | 3/2014 |
| CN | 104049739 A | 9/2014 |
| CN | 104281257 A | 1/2015 |
| CN | 105739612 A | 7/2016 |
| CN | 105739676 A | 7/2016 |
| CN | 106155306 A | 11/2016 |
| CN | 106547348 A | 3/2017 |
| CN | 107209560 A | 9/2017 |
| CN | 107209582 A | 9/2017 |
| CN | 107896508 A | 4/2018 |
| CN | 208861246 U | 5/2019 |
| DE | 102016111634 A1 | 12/2017 |
| GB | 2442973 A | 4/2008 |
| JP | 2001104256 A | 4/2001 |
| JP | 2008171409 A | 7/2008 |
| JP | 2009104428 A | 5/2009 |
| JP | 2013003782 A | 1/2013 |
| JP | 2014142206 A | 8/2014 |
| JP | 2014142751 A | 8/2014 |
| JP | 2015521303 A | 7/2015 |
| JP | 2015219887 A | 12/2015 |
| JP | 2016033815 A | 3/2016 |
| JP | 2016118929 A | 6/2016 |
| KR | 1020140016122 A | 2/2014 |
| KR | 20190067723 A | 6/2019 |
| WO | 2008112519 A1 | 9/2008 |
| WO | 2012176610 A1 | 12/2012 |
| WO | 2017220686 A1 | 12/2017 |

OTHER PUBLICATIONS

Girard et al., HapTip: Displaying Haptic Shear Forces at the Fingertips for Multi-Finger Interaction in Virtual Environments, Frontiers in ICT, vol. 3, Article 6, Apr. 2016, 15 pages.

Heo et al., "Finger Flexion Force Sensor based on Volar Displacement of Flexor Tendon", 2012 IEEE International Conference on Robotics and Automation, RiverCentre, Saint Paul, Minnesota, USA, May 14-18, 2012, pp. 1392-1397.

Haptic device to present contact sensation (Year: 2009).

NPL Survey of finger augmentation devices (Year: 2015).

* cited by examiner

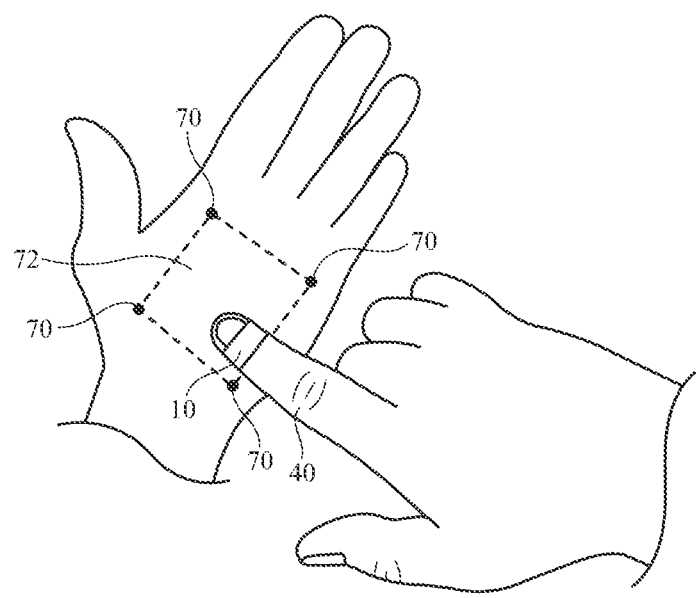
FIG. 9
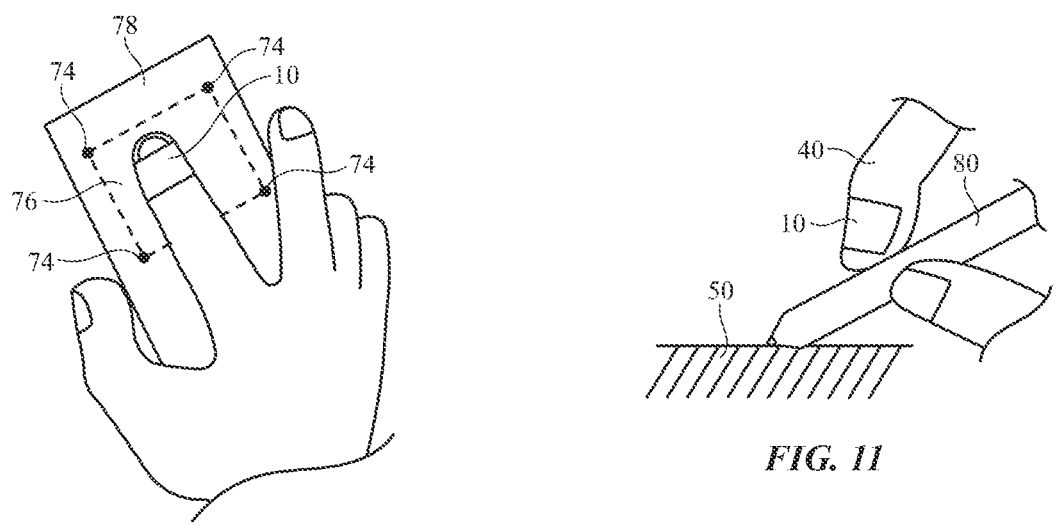
FIG. 10
FIG. 11

FINGER-MOUNTED INPUT DEVICES

This application claims the benefit of provisional patent application No. 62/904,547, filed Sep. 23, 2019, which is hereby incorporated by reference herein in its entirety.

FIELD

This relates generally to electronic devices, and, more particularly, to finger-mounted electronic devices.

BACKGROUND

Electronic devices such as computers can be controlled using computer mice and other input accessories.

Devices such as these may not be convenient for a user and may be cumbersome or uncomfortable.

SUMMARY

A system may include an electronic device and one or more finger devices. The electronic device may have a display and the user may provide finger input to the finger device to control the display. The finger input may include pinching, tapping, rotating, swiping, pressing, and/or other finger gestures that are detected using sensors in the finger device.

The finger device may be worn on a finger of a user while leaving a finger pad at the tip of the finger exposed. The finger device may include sensors that detect movement of the finger wearing the finger device and/or sensors that detect input from adjacent fingers. For example, to detect movement of the finger wearing the finger device, the finger device may include a motion sensor, a force sensor that measures how forcefully the finger is pressed against one or both sides of the finger device as the finger contacts a surface (e.g., a surface of an object or a surface of another finger such as a thumb finger), and/or a distance sensor such as an optical distance sensor that measures changes in distance between the finger and the sensor. By detecting the small movements of the finger wearing the finger device, the finger device may be used to detect finger gestures such as pinching and pulling, pinching and rotating, swiping, and tapping.

A touch sensor on a finger device may include a one-dimensional or two-dimensional array of sensor elements that detect touch input on the outside of the finger device (e.g., from an adjacent finger and/or a finger on the opposing hand). The sensor elements may be capacitive sensor electrodes or touch sensor elements based on optical sensing, ultrasonic sensing, or other types of sensing.

Sensor data related to finger gestures (finger gestures to an input region in air or on a surface, finger gestures may with one, two, three or more fingers, finger gestures associated with touch input to the touch sensor on the exterior of the finger device) may be combined with user gaze information to control items on the display (e.g., to navigate a menu on a display, to scroll through a document, to manipulate computer-aided designs, etc.).

BRIEF DESCRIPTION OF THE DRAWINGS

FIG. 9 is a perspective view of an illustrative finger device being used to detect finger input to a user's hand in accordance with an embodiment.

FIG. 10 is a perspective view of an illustrative finger device being used to detect finger input to a surface of an object in accordance with an embodiment.

FIG. 11 is a perspective view of an illustrative finger device being used to detect finger input as the user holds an object in accordance with an embodiment.

DETAILED DESCRIPTION

Figure 1:
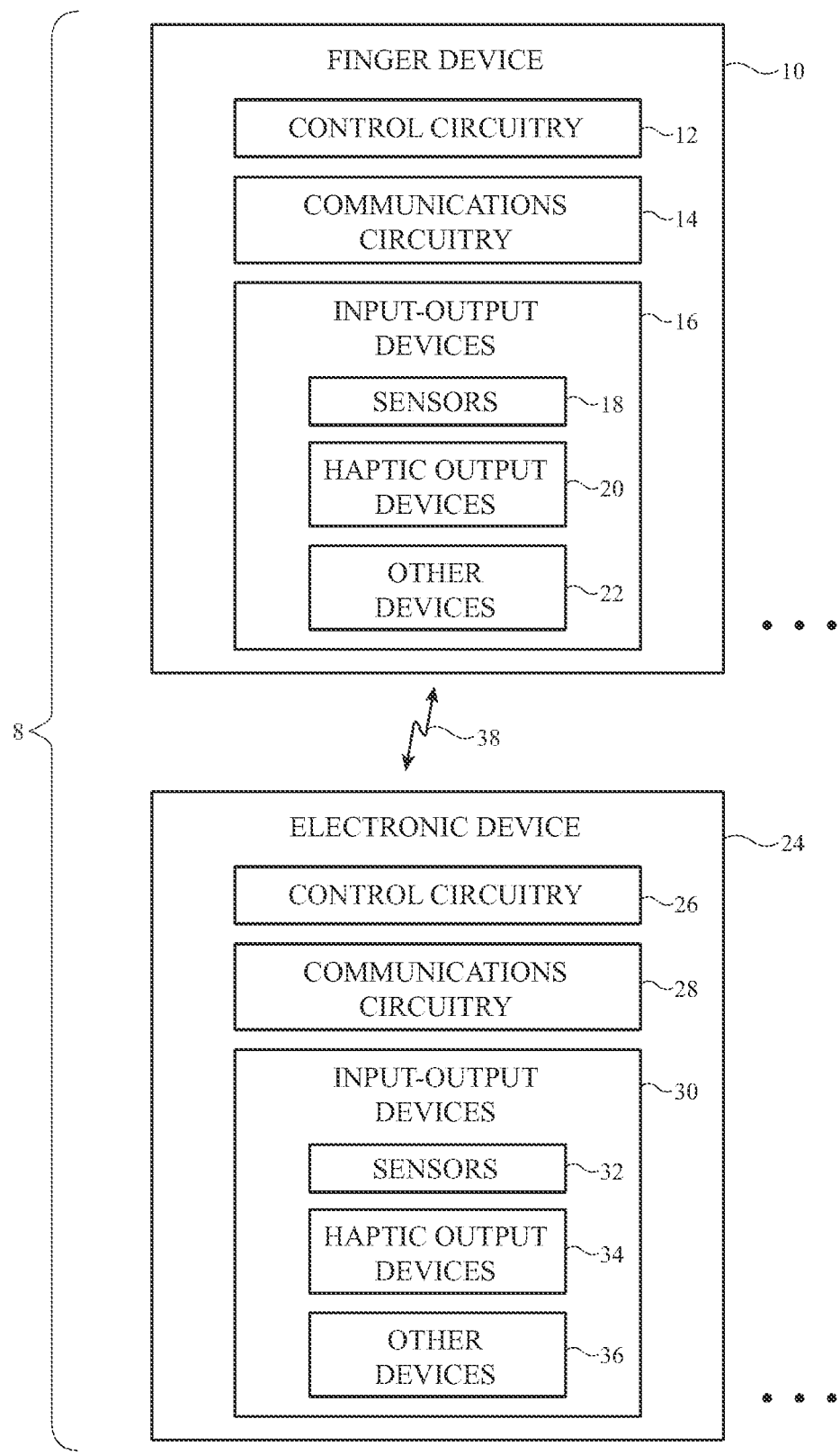
FIG. 1 is a schematic diagram of an illustrative system with a finger device in accordance with an embodiment.

Electronic devices that are configured to be mounted on the body of a user may be used to gather user input and to provide a user with output. For example, electronic devices that are configured to be worn on one or more of a user's fingers, which are sometimes referred to as finger devices or finger-mounted devices, may be used to gather user input and to supply output. A finger device may, as an example, include an inertial measurement unit with an accelerometer for gathering information on finger motions such as finger taps or free-space finger gestures, may include force sensors for gathering information on normal and shear forces in the finger device and the user's finger, and may include other sensors for gathering information on the interactions between the finger device (and the user's finger on which the device is mounted) and the surrounding environment. The finger device may include a haptic output device to provide the user's finger with haptic output and may include other output components.

One or more finger devices may gather user input from a user. The user may use finger devices in operating a display and/or a virtual reality or mixed reality device (e.g., head-mounted equipment such as glasses, goggles, a helmet, or other device with a display). During operation, the finger devices may gather user input such as information on interactions between the finger device(s) and the surrounding environment (e.g., interactions between a user's fingers and the environment, including finger motions and other interactions associated with virtual content displayed for a user). The user input may be used in controlling visual output on the display. Corresponding haptic output may be provided to the user's fingers using the finger devices. Haptic output may be used, for example, to provide the fingers of a user with a desired texture sensation as a user is touching a real object or as a user is touching a virtual object. Haptic output can also be used to create detents and other haptic effects.

Finger devices can be worn on any or all of a user's fingers (e.g., the index finger, the index finger and thumb, three of a user's fingers on one of the user's hands, some or all fingers on both hands, etc.). To enhance the sensitivity of a user's touch as the user interacts with surrounding objects, finger devices may have inverted U shapes or other configurations that allow the finger devices to be worn over the top and sides of a user's finger tips while leaving the user's finger pads exposed. This allows a user to touch objects with the finger pad portions of the user's fingers during use. If desired, finger devices may be worn over knuckles on a user's finger, between knuckles, and/or on other portions of a user's finger. The use of finger devices on a user's finger tips is sometimes described herein as an example.

Users can use the finger devices to interact with any suitable electronic equipment. For example, a user may use one or more finger devices to supply input to a desktop computer, tablet computer, cellular telephone, watch, ear buds, or other accessory, to interact with a virtual reality or mixed reality system (e.g., a head-mounted device with a display), or to interact with other electronic equipment.

FIG. 1 is a schematic diagram of an illustrative system of the type that may include one or more finger devices. As shown in FIG. 1, system 8 may include electronic device(s) such as finger device(s) 10 and other electronic device(s) 24. Each finger device 10 may be worn on a finger of a user's hand. Additional electronic devices in system 8 such as devices 24 may include devices such as a laptop computer, a computer monitor containing an embedded computer, a tablet computer, a desktop computer (e.g., a display on a stand with an integrated computer processor and other computer circuitry), a cellular telephone, a media player, or other handheld or portable electronic device, a smaller device such as a wristwatch device, a pendant device, a headphone or earpiece device, a head-mounted device such as glasses, goggles, a helmet, or other equipment worn on a user's head, or other wearable or miniature device, a television, a computer display that does not contain an embedded computer, a gaming device, a remote control, a navigation device, an embedded system such as a system in which equipment is mounted in a kiosk, in an automobile, airplane, or other vehicle, a removable external case for electronic equipment, a strap, a wrist band or head band, a removable cover for a device, a case or bag that has straps or that has other structures to receive and carry electronic equipment and other items, a necklace or arm band, a wallet, sleeve, pocket, or other structure into which electronic equipment or other items may be inserted, part of a chair, sofa, or other seating (e.g., cushions or other seating structures), part of an item of clothing or other wearable item (e.g., a hat, belt, wrist band, headband, sock, glove, shirt, pants, etc.), or equipment that implements the functionality of two or more of these devices.

With one illustrative configuration, which may sometimes be described herein as an example, device 10 is a finger-mounted device having a finger-mounted housing with a U-shaped body that grasps a user's finger or a finger-mounted housing with other shapes configured to rest against a user's finger and device(s) 24 is a cellular telephone, tablet computer, laptop computer, wristwatch device, head-mounted device, a device with a speaker, or other electronic device (e.g., a device with a display, audio components, and/or other output components). A finger device with a U-shaped housing may have opposing left and right sides that are configured to receive a user's finger and a top housing portion that couples the left and right sides and that overlaps the user's fingernail.

Devices 10 and 24 may include control circuitry 12 and 26. Control circuitry 12 and 26 may include storage and processing circuitry for supporting the operation of system 8. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 12 and 26 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between devices 10 and 24 and/or to support communications between equipment in system 8 and external electronic equipment, control circuitry 12 may communicate using communications circuitry 14 and/or control circuitry 26 may communicate using communications circuitry 28. Circuitry 14 and/or 28 may include antennas, radio-frequency transceiver circuitry, and other wireless communications circuitry and/or wired communications circuitry. Circuitry 14 and/or 28, which may sometimes be referred to as control circuitry and/or control and communications circuitry, may, for example, support bidirectional wireless communications between devices 10 and 24 over wireless link 38 (e.g., a wireless local area network link, a near-field communications link, or other suitable wired or wireless communications link (e.g., a Bluetooth® link, a WiFi® link, a 60 GHz link or other millimeter wave link, etc.). Devices 10 and 24 may also include power circuits for transmitting and/or receiving wired and/or wireless power and may include batteries. In configurations in which wireless power transfer is supported between devices 10 and 24, in-band wireless communications may be supported using inductive power transfer coils (as an example).

Devices 10 and 24 may include input-output devices such as devices 16 and 30. Input-output devices 16 and/or 30 may be used in gathering user input, in gathering information on the environment surrounding the user, and/or in providing a user with output. Devices 16 may include sensors 18 and devices 24 may include sensors 32. Sensors 18 and/or 32 may include force sensors (e.g., strain gauges, capacitive force sensors, resistive force sensors, etc.), audio sensors such as microphones, touch and/or proximity sensors such as capacitive sensors, optical sensors such as optical sensors that emit and detect light, ultrasonic sensors (e.g., ultrasonic sensors for tracking device orientation and location and/or for detecting user input such as finger input), and/or other touch sensors and/or proximity sensors, monochromatic and color ambient light sensors, image sensors, sensors for detecting position, orientation, and/or motion (e.g., accelerometers, magnetic sensors such as compass sensors, gyroscopes, and/or inertial measurement units that contain some or all of these sensors), muscle activity sensors (EMG) for detecting finger actions, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, optical sensors such as visual odometry sensors that gather position and/or orientation information using images gathered with digital image sensors in cameras, gaze tracking sensors, visible light and/or infrared cameras having digital image sensors, humidity sensors, moisture sensors, and/or other sensors. In some arrangements, devices 10 and/or 24 may use sensors 18 and/or 32 and/or other input-output devices 16 and/or 30 to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.). If desired, device 10 and/or device 24 may include rotating buttons (e.g., a crown mechanism on a watch or finger device or other suitable rotary button that rotates and that optionally can be depressed to select items of interest). Alphanumeric keys and/or other buttons may be included in devices 16 and/or 30. In some configurations, sensors 18 may include joysticks, roller balls, optical sensors (e.g., lasers that emit light and image sensors that track motion by monitoring and analyzing changings in the speckle patterns and other information associated with surfaces illuminated with the emitted light as device 10 is moved relative to those surfaces), fingerprint sensors, and/or other sensing circuitry. Radio-frequency tracking devices may be included in sensors 18 to detect location, orientation, and/or range. Beacons (e.g., radio-frequency beacons) may be used to emit radio-frequency signals at different locations in a user's environment (e.g., at one or more registered locations in a user's home or office). Radio-frequency beacon signals can be analyzed by devices 10 and/or 24 to help determine the location and position of devices 10 and/or 24 relative to the beacons. If desired, devices 10 and/or 24 may include beacons. Frequency strength (received signal strength information), beacon orientation, time-of-flight information, and/or other radio-frequency information may be used in determining orientation and position information. At some frequencies (e.g., lower frequencies such as frequencies below 10 GHz), signal strength information may be used, whereas at other frequencies (e.g., higher frequencies such as frequencies above 10 GHz), indoor radar schemes may be used). If desired, light-based beacons, ultrasonic beacons, and/or other beacon devices may be used in system 8 in addition to or instead of using radio-frequency beacons and/or radio-frequency radar technology.

Devices 16 and/or 30 may include haptic output devices 20 and/or 34. Haptic output devices 20 and/or 34 can produce motion that is sensed by the user (e.g., through the user's fingertips). Haptic output devices 20 and/or 34 may include actuators such as electromagnetic actuators, motors, piezoelectric actuators, electroactive polymer actuators, vibrators, linear actuators (e.g., linear resonant actuators), rotational actuators, actuators that bend bendable members, actuator devices that create and/or control repulsive and/or attractive forces between devices 10 and/or 24 (e.g., components for creating electrostatic repulsion and/or attraction such as electrodes, components for producing ultrasonic output such as ultrasonic transducers, components for producing magnetic interactions such as electromagnets for producing direct-current and/or alternating-current magnetic fields, permanent magnets, magnetic materials such as iron or ferrite, and/or other circuitry for producing repulsive and/or attractive forces between devices 10 and/or 24). In some situations, actuators for creating forces in device 10 may be used in squeezing a user's finger and/or otherwise directly interacting with a user's finger pulp. In other situations, these components may be used to interact with each other (e.g., by creating a dynamically adjustable electromagnetic repulsion and/or attraction force between a pair of devices 10 and/or between device(s) 10 and device(s) 24 using electromagnets).

If desired, input-output devices 16 and/or 30 may include other devices 22 and/or 36 such as displays (e.g., in device 24 to display images for a user), status indicator lights (e.g., a light-emitting diode in device 10 and/or 24 that serves as a power indicator, and other light-based output devices), speakers and other audio output devices, electromagnets, permanent magnets, structures formed from magnetic material (e.g., iron bars or other ferromagnetic members that are attracted to magnets such as electromagnets and/or permanent magnets), batteries, etc. Devices 10 and/or 24 may also include power transmitting and/or receiving circuits configured to transmit and/or receive wired and/or wireless power signals.

Figure 2:
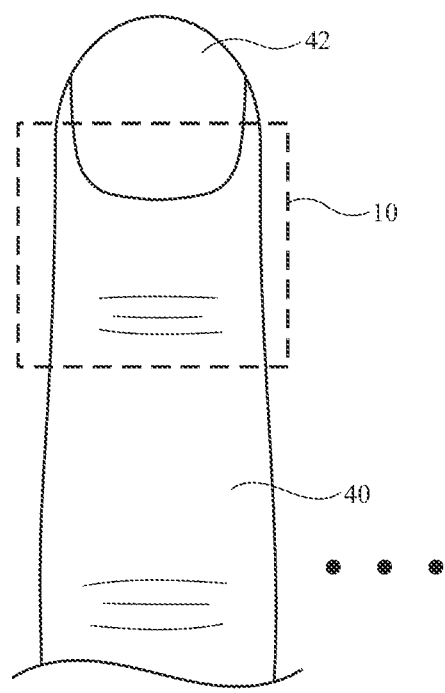
FIG. 2 is a top view of an illustrative finger of a user on which a finger device has been placed in accordance with an embodiment.

FIG. 2 is a top view of a user's finger (finger 40) and an illustrative finger-mounted device 10. As shown in FIG. 2, device 10 may be formed from a finger-mounted unit that is mounted on or near the tip of finger 40 (e.g., partly or completely overlapping fingernail 42). If desired, device 10 may be worn elsewhere on a user's fingers such as over a knuckle, between knuckles, etc. Configurations in which a device such as device 10 is worn between fingers 40 may also be used.

A user may wear one or more of devices 10 simultaneously. For example, a user may wear a single one of devices 10 on the user's ring finger or index finger. As another example, a user may wear a first device 10 on the user's thumb, a second device 10 on the user's index finger, and an optional third device 10 on the user's middle finger. Arrangements in which devices 10 are worn on other fingers and/or all fingers of one or both hands of a user may also be used.

Control circuitry 12 (and, if desired, communications circuitry 14 and/or input-output devices 16) may be contained entirely within device 10 (e.g., in a housing for a fingertip-mounted unit) and/or may include circuitry that is coupled to a fingertip structure (e.g., by wires from an associated wrist band, glove, fingerless glove, etc.). Configurations in which devices 10 have bodies that are mounted on individual user fingertips are sometimes described herein as an example.

Figure 3:
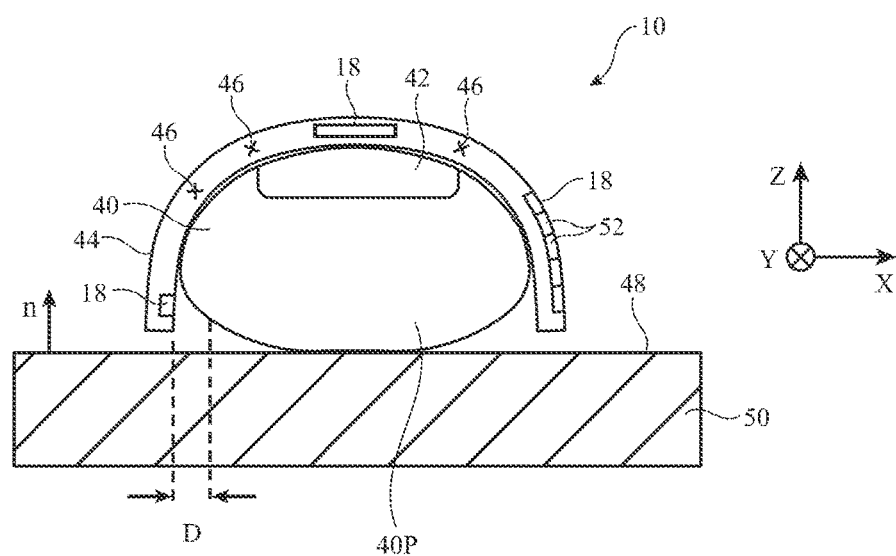
FIG. 3 is a cross-sectional side view of an illustrative finger device on the finger of a user in accordance with an embodiment.

FIG. 3 is a cross-sectional side view of an illustrative finger device (finger-mounted device) 10 showing illustrative mounting locations 46 for electrical components (e.g., control circuitry 12, communications circuitry 14, and/or input-output devices 16 such as sensors 18, haptic output devices 20, and/or other devices 22) within and/or on the surface(s) of finger device housing 44. These components may, if desired, be incorporated into other portions of housing 44.

As shown in FIG. 3, housing 44 may have a U shape (e.g., housing 44 may be a U-shaped housing structure that faces downwardly and covers the upper surface of the tip of user finger 40 and fingernail 42). During operation, a user may press against structures such as structure 50. As the bottom of finger 40 (e.g., finger pulp 40P) presses against surface 48 of structure 50, the user's finger may compress and force portions of the finger outwardly against the sidewall portions of housing 44 (e.g., for sensing by sensors 18 mounted to the side portions of housing 44). Lateral movement of finger 40 in the X-Y plane may also be sensed using sensors 18 on the sidewalls of housing 44 or other portions of housing 44 (e.g., because lateral movement will tend to press portions of finger 40 against some sensors 18 more than others and/or will create shear forces that are measured by force sensors that are configured to sense shear forces). Sensors 18 may, for example, include force sensors that measure how forcefully finger 40 is pressed against the sidewalls or other portions of housing 44, and/or sensors 18 may include displacement sensors (e.g., optical distance sensors, ultrasonic distance sensors, other distance and/or displacement sensors) that measure changes in the distance D between finger 40 and sensors 18.

Sensors 18 in device 10 may include ultrasonic sensors, optical sensors, inertial measurement units, strain gauges and other force sensors, capacitive sensors, radio-frequency sensors, and/or other sensors that may be used in gathering sensor measurements indicative of the activities of finger 40 and/or the activities of adjacent fingers. If desired, these sensors may also be used in mapping the contours of three-dimensional objects (e.g., by time-of-flight measurements and/or other measurements). For example, an ultrasonic sensor such as a two-dimensional image sensor or an ultrasonic sensor with a single ultrasonic transducer element may emit free-space ultrasonic sound signals that are received and processed after reflecting off of external objects. This allows a three-dimensional ultrasonic map to be generated indicating the shapes and locations of the external objects.

In some configurations, finger activity information (position, movement, orientation, etc.) may be gathered using sensors that are mounted in external electronic equipment (e.g., in a computer or other desktop device, in a head-mounted device or other wearable device, and/or in other electronic device 24 that is separate from device 10). For example, optical sensors such as images sensors that are separate from devices 10 may be used in monitoring devices 10 to determine their position, movement, and/or orientation. If desired, devices 10 may include passive and/or active optical registration features to assist an image sensor in device 24 in tracking the position, orientation, and/or motion of device 10. For example, devices 10 may include light-emitting devices such as light-emitting diodes, lasers (e.g., laser diodes, vertical cavity surface-emitting lasers, etc.), or other light sources and may operate at visible wavelengths, ultraviolet wavelengths, and/or infrared wavelengths. The light-emitting devices may be arranged in an asymmetric pattern on housing 44 and may emit light that is detected by an image sensor, depth sensor, and/or other light-based tracking sensor circuitry in device 24 (e.g., a head-mounted device, desktop computer, stand-alone camera-based monitoring systems, and/or other electrical equipment with an image sensor or other tracking sensor circuitry). By processing the received patterned of emitted light, device 24 can determine the position, orientation, and/or motion of device 10. If desired, the light-emitting devices can be removable and/or customizable (e.g., a user can customize the location and type of light-emitting devices).

Tracking can also be performed that involves extrapolating from a known body part orientation (e.g., a finger orientation) to produce orientation information on other body parts (e.g., wrist and/or arm orientation estimated using inverse kinematics). Visual odometry sensors may, if desired, be included in devices 10. These sensors may include image sensors that gather frames of image data of the surroundings of devices 10 and may be used in measuring position, orientation, and/or motion from the frame of image data. Lidar, ultrasonic sensors oriented in multiple directions, radio-frequency tracking sensors, and/or other finger device tracking arrangements may be used, if desired. In some arrangements, user input for controlling system 8 can include both user finger input and other user input (e.g., user eye gaze input, user voice input, etc.). For example, gaze tracking information such as a user's point-of-gaze measured with a gaze tracker can be fused with finger input when controlling device 10 and/or devices 24 in system 8. A user may, for example, gaze at an object of interest while device 10 using one or more of sensors 18 (e.g., an accelerometer, force sensor, touch sensor, etc.) to gather information such as tap input (movement of device 10 resulting in measurable forces and/or accelerometer output when device 10 strikes a table top or other external surface), double-tap input, force input, multi-finger gestures (taps, swipes, and/or other gestures on external surfaces and/or the housing surfaces of multiple devices 10), drag and drop operations associated with objects selected using a lingering gaze or other point-of-gaze input, etc. The finger input may include information on finger orientation, position, and/or motion and may include information on how forcefully a finger is pressing against surfaces (e.g., force information). Finger pointing input (e.g., the direction of finger pointing) may be gathered using radio-frequency sensors among sensors 18 and/or other sensors in device(s) 10.

If desired, user input may include air gestures (sometimes referred to as three-dimensional gestures or non-contact gestures) gathered with sensors 18 (e.g., proximity sensors, image sensors, ultrasonic sensors, radio-frequency sensors, etc.). Air gestures (e.g., non-contact gestures in which a user's fingers hover and/or move relative to the sensors 18 of device 10 and/or in which device 10 hovers and/or moves relative to external surfaces) and/or touch and/or force-based input may include multifinger gestures (e.g., pinch to zoom, etc.). In some arrangements, a user may wear one or more finger devices 10 on both hands, allowing for two-hand tracking. For example, finger devices 10 on one hand may be used for detecting click or tap input and finger devices 10 on the other hand may be used for detecting more complex finger gestures. In some embodiments, a user may wear multiple devices 10 on one hand (e.g., on a thumb and index finger) and these devices may be used to gather finger pinch input such as pinch click gesture input, pinch-to-zoom input, and/or pinch force input. For example, a pinch click input may be detected when a tap (e.g., a peak in an accelerometer output signal) for a thumb device correlates with a tap for an index finger device and/or pinch force input may be gathered by measuring strain gauge output with strain gauges in devices 10 as the devices 10 press against each other. Pinch force can also be detected by measuring the size of the contact patch produced when a finger presses against a two-dimensional touch sensor (larger contact area being associated with larger applied force). In other arrangements, pinch click gesture input and pinch force input may be gathered using only a single finger device (e.g., by measuring motion or forces of the finger pad or finger pulp of the finger wearing the finger device as the user pinches, presses, or taps on the finger pad with a thumb finger or other finger).

By correlating user input from a first of devices 10 with user input from a second of devices 10 and/or by otherwise analyzing finger device sensor input, pinch gestures (e.g., pinch click or pinch tap gestures and/or pinch force input) and other finger device input may be detected and used in manipulating displayed content or taking other actions in system 8. Consider, as an example, the use of a pinch gesture to select a displayed object associated with a user's current point-of-gaze. Once the displayed object has been selected based on the direction of the user's point-of-gaze (or finger point direction input) and based on the pinch gesture input or other user input, further user input gathered with one or more devices 10 may be used to rotate and/or otherwise manipulate the displayed object. For example, information on finger movement (e.g., rotational movement) may be gathered using an internal measurement unit or other sensor 18 in device(s) 10 and this rotational input used to rotate the selected object. In some scenarios, an object may be selected based on point-of-gaze (e.g., when a user's point-of-gaze is detected as being directed toward the object) and, following selection, object attributes (e.g., virtual object attributes such as virtual object appearance and/or real-world object attributes such as the operating settings of a real-world device) can be adjusted using strain gauge or touch sensor contact patch pinch input (e.g., detected pinch force between finger devices 10 that are being pinched together on opposing fingers) and/or can be adjusted using finger device orientation input (e.g., to rotate a virtual object, etc.).

If desired, gestures such as air gestures (three-dimensional gestures) may involve additional input. For example, a user may control system 8 using hybrid gestures that involve movement of device(s) 10 through the air (e.g., an air gesture component) and that also involve contact (and, if desired, movement) of a thumb or other finger against a two-dimensional touch sensor, force sensor, or other sensor 18. As an example, an inertial measurement unit may detect user movement of finger 40 through the air (e.g., to trace out a path) while detecting force input, touch input, or other input (e.g., finger pinch input or other input to adjust a line or other virtual object that is being drawn along the path).

Sensors 18 in device 10 may, for example, measure how forcefully a user is moving device 10 (and finger 40) against surface 48 (e.g., in a direction parallel to the surface normal n of surface 48 such as the −Z direction of FIG. 3) and/or how forcefully a user is moving device 10 (and finger 40) within the X-Y plane, tangential to surface 48. The direction of movement of device 10 in the X-Y plane and/or in the Z direction can also be measured by the force sensors and/or other sensors 18 at locations 46.

Structure 50 may be a portion of a housing of device 24, may be a portion of another device 10 (e.g., another housing 44), may be a portion of a user's finger 40 or other body part, may be a surface of a real-world object such as a table, a movable real-world object such as a bottle or pen, or other inanimate object external to device 10, and/or may be any other structure that the user can contact with finger 40 while moving finger 40 in a desired direction with a desired force. Because motions such as these can be sensed by device 10, device(s) 10 can be used to gather pointing input (e.g., input moving a cursor or other virtual object on a display such as a display in devices 24), can be used to gather tap input, swipe input, pinch-to-zoom input (e.g., when a pair of devices 10 is used), or other gesture input (e.g., finger gestures, hand gestures, arm motions, etc.), and/or can be used to gather other user input.

Sensors 18 may include a touch sensor formed from an array of capacitive touch sensor electrodes such as electrodes 52 overlapping the side and/or top surfaces of housing 44. Touch sensor electrodes 52 of sensor 18 may be used to gather touch input such as input from direct contact and/or close proximity with a different finger of the user or other external object. In the example of FIG. 3, touch sensor electrodes 52 may form a touch input area on the outer surface of the side(s) of device 10.

System 8 may have display devices or other devices that present image content to a user. One or more finger devices 10 may be used to interact with the display devices. For example, finger devices 10 may be used to scroll through menu options on a display, to scroll through web browser pages on a display, to provide input to computer-aided design software that is running on a display device, and/or to provide other input to a display (e.g., a desktop display, a laptop display, a cellular telephone display, a tablet display, or other display that displays two-dimensional image content, and/or displays that display three-dimensional image content such as head-mounted displays, etc.).

FIGS. 4, 5, 6, and 7 show illustrative types of user input that may be detected with one or more finger devices and that may be used to provide input to a device with a display.

Figure 4:
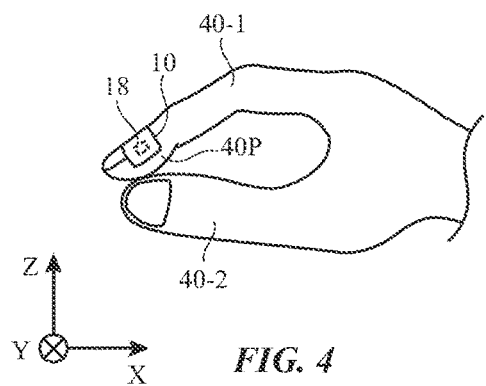
FIG. 4 is a perspective view of an illustrative finger device being used to detect finger pinch input in accordance with an embodiment.

In the example of FIG. 4, finger device 10 is being used to detect finger input to the finger pulp. In particular, sensors 18 in device 10 may measure the activity of finger 40-1 (e.g., a pointer finger or other suitable finger wearing device 10) as finger 40-2 (e.g., a thumb or other suitable finger) makes contact with finger pulp 40P of finger 40-1. This may include, for example, detecting how forcefully finger 40-2 presses against finger pulp 40P (e.g., how forcefully finger pulp 40P is pressed inwardly towards the fingernail), detecting small changes in distance between finger 40-1 and sensors 18 (and/or detecting how forcefully finger 40-1 is pressed against the sidewalls of device 10) as finger 40-2 moves finger pulp 40P around, from side to side, from front to back, etc., and/or measuring other properties of finger 40-1 as finger 40-2 makes contact with finger pulp 40P. Sensors 18 may detect lateral movement of finger pulp 40P (e.g., movement in the X-Y plane) in which pulp 40P moves relative to finger 40-2 and may also detect movement of finger pulp 40P that results in shear force in the X-Y plane with little or no actual movement of pulp 40P relative to finger 40-2. Sensors 18 may detect and distinguish between a tap (e.g., where finger 40-2 lightly and briefly contacts finger pulp 40P), a press (e.g., where finger 40-2 forcefully and briefly contacts finger pulp 40P), a pinch (e.g., where finger 40-2 forcefully contacts finger pulp 40P for a longer time period), and/or other finger input to finger pulp 40P.

Figure 5:
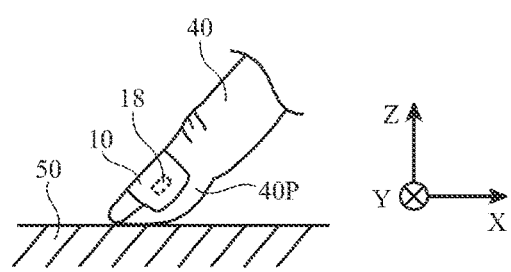
FIG. 5 is a perspective view of an illustrative finger device being used to detect finger input on a surface in accordance with an embodiment.

FIG. 5 shows an example in which finger device 10 is being used to detect finger input on a surface of structure 50. In particular, sensors 18 in device 10 may measure the activity of finger 40 (e.g., a pointer finger or other suitable finger wearing device 10) as finger 40 makes contact with the surface of structure 50. This may include, for example, detecting how forcefully finger 40 presses against structure 50 (e.g., how forcefully finger pulp 40P is pressed inwardly towards the fingernail), detecting small changes in distance between finger 40 and sensors 18 (and/or detecting how forcefully finger 40 is pressed against the sidewalls of device 10) as finger 40 moves finger pulp 40P on structure 50 around, from side to side, from front to back, etc., and/or measuring other properties of finger 40 as finger 40 makes contact with structure 50. Sensors 18 may detect lateral movement of finger 40 (e.g., movement in the X-Y plane) in which pulp 40P moves relative to the surface of structure 50 and may also detect movement of finger 40 that results in shear force in the X-Y plane with little or no actual movement of pulp 40P relative to the surface of structure 50. Sensors 18 may detect and distinguish between a tap (e.g., where finger 40 lightly and briefly contacts structure 50), a press (e.g., where finger 40 forcefully but briefly contacts structure 50), a press-and-hold (e.g., where finger 40 forcefully contacts structure 50 for a longer time period), and/or other finger input on structure 50.

Figure 6:
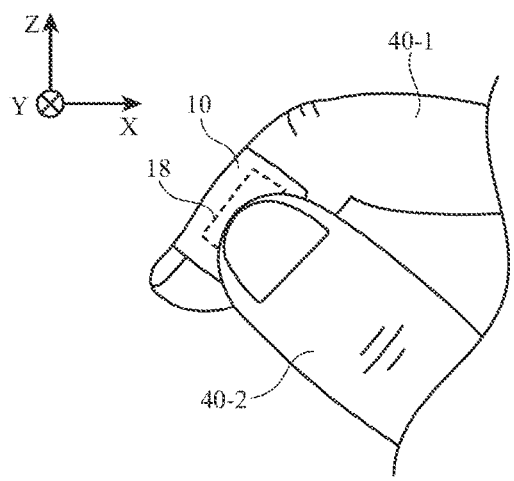
FIG. 6 is a perspective view of an illustrative finger device being used to detect input on the finger device in accordance with an embodiment.

FIG. 6 shows an example in which finger device 10 is being used to detect finger input on device 10. In particular, device 10 may be worn on finger 40-1 (e.g., a pointer finger or other suitable finger) and may detect activities of finger 40-2 (e.g., a thumb or other suitable finger) as it makes contact with and/or as it comes in proximity to device 10.

This may include, for example, detecting how forcefully finger 40-2 presses against device 10 and/or detecting swipes, pinches, taps, presses, press-and-holds, or other gestures on device 10. Sensors 18 may, for example, include a touch sensor formed from a one-dimensional or two-dimensional array of capacitive touch sensor electrodes (e.g., electrodes 52 of FIG. 3) and/or may include other sensors for detecting touch input, force input, and/or other input involving contact between the user's fingers and device 10.

Figure 7:
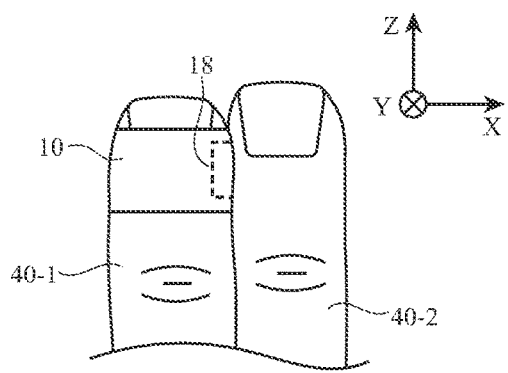
FIG. 7 is a perspective view of an illustrative finger device being used to detect an adjacent finger in accordance with an embodiment.

FIG. 7 is an example in which device 10 is being used to detect the proximity of one or more adjacent fingers. In particular, device 10 may be worn on finger 40-1 (e.g., a pointer finger or other suitable finger) and may detect activities of finger 40-2 (e.g., a middle finger or other suitable finger) as it makes contact with and/or as it comes in proximity to device 10. For example, sensors 18 may detect when the middle finger is in contact with and/or in proximity to the pointer finger wearing device 10 (e.g., when finger 40-2 and finger 40-1 are side-to-side, when finger 40-2 is stacked on top of or below finger 40-1, etc.). Detecting when finger 40-1 is in contact with or close proximity to finger 40-1 may be used to provide a different type of input than that associated with a single finger. For example, finger gestures made with two side-by-side fingers as shown in FIG. 7 may be used to scroll through content on a display whereas finger gestures made with a single finger may be used to move a cursor on a display.

If desired, the finger gestures of FIGS. 4, 5, 6, and 7 may be combined with one another and/or combined with other finger gestures to provide different types of user input to a display. As an example, a user may select an item on a display by tapping or pinching finger pulp 40P (e.g., as shown in FIG. 4) and, once the item has been selected, the user may manipulate the selected item by providing touch input to a touch sensor on device 10 (e.g., as shown in FIG. 6). Multi-finger gestures may be detected by detecting an adjacent finger as the user pinches against the finger pulp of a finger wearing device 10 (e.g., as discussed in connection with FIG. 4), by detecting an adjacent finger as the user presses a finger wearing device 10 against a surface (e.g., as discussed in connection with FIG. 5), by detecting an adjacent finger as the user touches the outside of device 10 (e.g., as discussed in connection with FIG. 6), etc.

Figure 8:
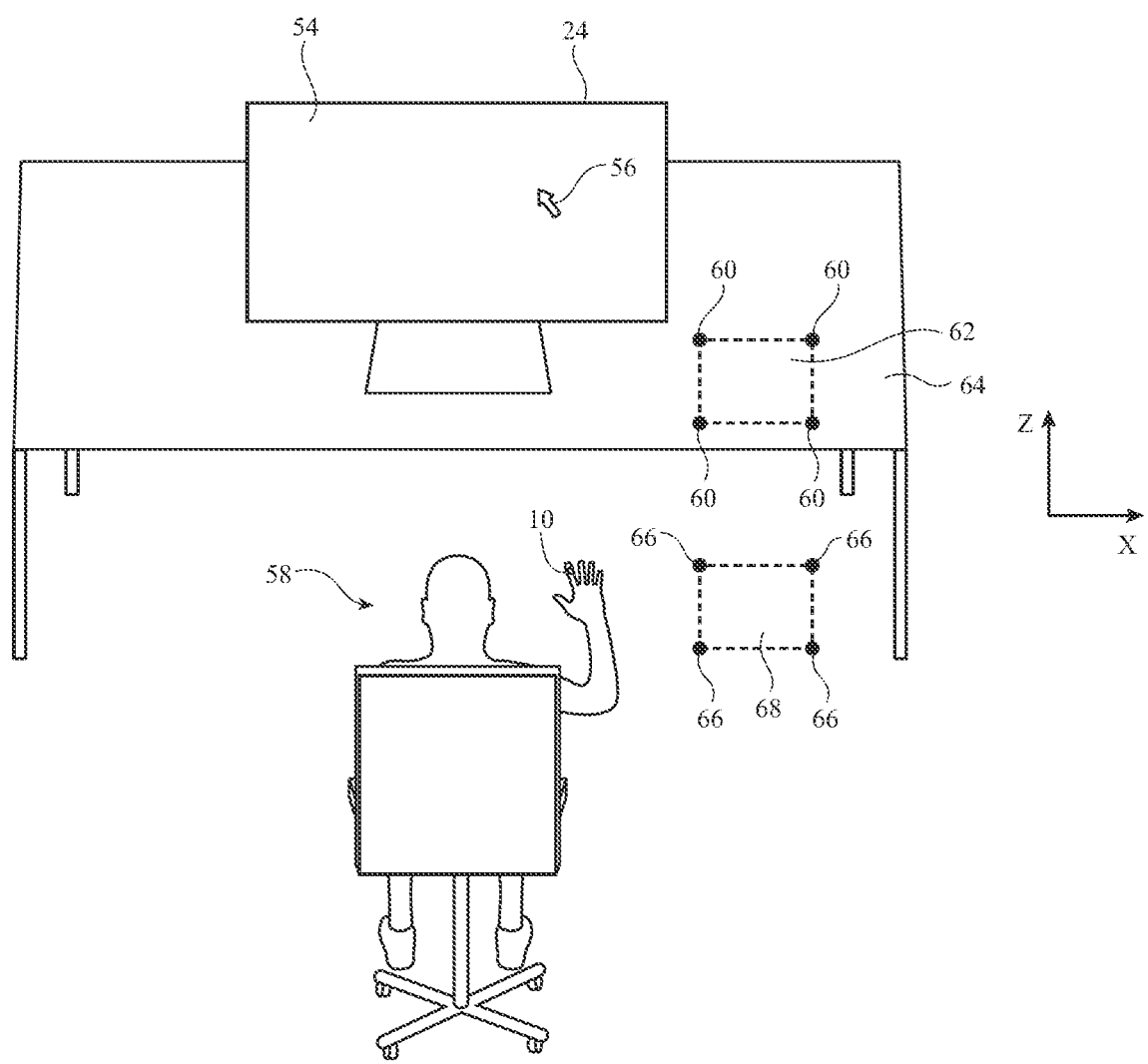
FIG. 8 is a perspective view of an illustrative electronic device with which a user may interact using one or more finger devices in accordance with an embodiment.

If desired, one or more finger devices 10 may be used to provide track pad input to an electronic device. In a track pad arrangement, a user may make track pad gestures (e.g., taps, presses, pinch-to-zoom, scrolling, swiping, etc.) on any surface (e.g., a non-touch-sensitive surface) and/or in the air to provide input to an electronic device. Consider, as an example, a scenario of the type shown in FIG. 8. In this example, device 24 has a display such as display 54 that is configured to display images for user 58. The image may include one or more objects (e.g., visual items) such as object 56. Object 56 may be a cursor or any other displayed content.

User 58 may provide input to electronic device 24 using finger device 10. In some arrangements, user 58 may wish to provide track pad type input to control objects on display 54 such as cursor 56 or other items on display 54. When the user wishes to provide track pad type input, the user may define the boundaries of the region that is intended to be used as a track pad region. For example, a user may define the boundaries of an input region on a surface such as surface 64 (e.g., a table, desk, or other surface) by tapping in locations 60 on surface 64 with the finger wearing device 10. Device 10 may have sensors 18 that detect the first, second, third, and fourth taps in locations 60 on surface 64 (e.g., taps of the type described in connection with FIG. 5) and may register region 62 within locations 60 as an input region for receiving touch pad type input.

Once a user has defined the boundaries of an input region 62 on surface 64, the user may provide input to region 62 as if region 62 were a track pad (e.g., a touch-sensitive surface). In particular, device 10 may detect finger gestures (e.g., taps, swipes, pinch-to-zoom gestures, two-finger scrolling gestures, and other finger gestures) on surface 64 in region 62 which may be used to control electronic device 24 and/or objects being displayed on display 54 such as cursor 56. Finger gestures in region 62 may be interpreted differently than finger gestures outside of region 62, if desired. In this way, device 10 may be used to turn any surface into a touch pad surface. The use of four points to define the boundaries of input region 62 is merely illustrative. If desired, a user may define only one point, only two points, three or more points, and/or may draw a rectangle, circle, or other shape with his or her finger on the desired surface to turn that region of the surface into an input region. Arrangements in which the boundaries of an input region are predefined may also be used.

In addition to or instead of turning surfaces such as surface 64 into an input region, user 58 turn a region of free space into an input region. This may be achieved by defining an area in space that is to be used as the input region. For example, user 58 may pinch his or her fingers in locations 66 to define the boundaries of input region 68 in space. Device 10 may detect first, second, third, and fourth pinches in locations 66 (e.g., pinches, taps, or other finger-to-finger input of the type described in connection with FIG. 4) and may register region 68 within locations 66 as an input region for receiving touch pad type input or other suitable user input. Once a user has defined the boundaries of input region 68, the user may provide input to region 68 as if region 68 were a track pad. In particular, device 10 may detect finger gestures (e.g., taps, swipes, pinch-to-zoom gestures, two-finger scrolling gestures, and other finger gestures) in region 68 which may be used to control electronic device 24 and/or objects being displayed on display 54 such as cursor 56. Finger gestures in region 68 may be interpreted differently than finger gestures outside of region 68, if desired. In this way, device 10 may be used to turn any region of space into an input region. The use of four points to define the boundaries of input region 68 is merely illustrative. If desired, a user may define only one point, only two points, three or more points, and/or may draw a rectangle, circle, or other shape with his or her finger in the desired region to turn that region of space into an input region. Arrangements in which the boundaries of an input region are predefined may also be used.

FIG. 9 illustrates how a user may use his or her hand as a track pad surface. When the user wishes to provide track pad type input, the user may define the boundaries of an input region on his or her hand by tapping in locations 70 on the palm of his or her hand (or on any other portion of the user's body) with the finger wearing device 10. Device 10 may detect the first, second, third, and fourth taps in locations 70 (e.g., taps of the type described in connection with FIG. 5) and may register region 72 within locations 70 as an input region for receiving touch pad type input. Once a user has defined the boundaries of an input region 72 on his or her hand, the user may provide input to region 72 as if region 72 were a track pad (e.g., a touch-sensitive surface). In particular, device 10 may detect finger gestures (e.g., taps, swipes, pinch-to-zoom gestures, two-finger scrolling gestures, and other finger gestures) in region 72 which may be used to control an electronic device and/or objects on a display (e.g., display 54 of FIG. 8). Finger gestures in region 72 may be interpreted differently than finger gestures outside of region 72, if desired. In this way, device 10 may be used to turn any surface of the user's body into a touch pad surface. The use of four points to define the boundaries of input region 72 is merely illustrative. If desired, a user may define only one point, only two points, three or more points, and/or may draw a rectangle, circle, or other shape with his or her finger on a body part to turn that region of the body into an input region. Arrangements in which the boundaries of an input region are predefined may also be used.

FIG. 10 illustrates how a user may use a movable object as a track pad surface. When the user wishes to provide track pad type input, the user may define the boundaries of an input region on an object such as object 78 by tapping in locations 74 on object 78 with the finger wearing device 10. Device 10 may detect the first, second, third, and fourth taps in locations 74 (e.g., taps of the type described in connection with FIG. 5) and may register region 76 within locations 74 as an input region for receiving touch pad type input. Once a user has defined the boundaries of input region 76 on object 78, the user may provide input to region 76 as if region 76 were a track pad (e.g., a touch-sensitive surface). In particular, device 10 may detect finger gestures (e.g., taps, swipes, pinch-to-zoom gestures, two-finger scrolling gestures, and other finger gestures) in region 76 which may be used to control an electronic device and/or objects on a display (e.g., display 54 of FIG. 8). Finger gestures in region 76 may be interpreted differently than finger gestures outside of region 76, if desired. In this way, device 10 may be used to turn any surface of any object (e.g., a non-touch-sensitive surface of a cellular telephone, a non-touch-sensitive surface of an object without electronics, etc.) into a touch pad surface. The use of four points to define the boundaries of input region 76 is merely illustrative. If desired, a user may define only one point, only two points, three or more points, and/or may draw a rectangle, circle, or other shape with his or her finger on the desired surface to turn that region of the surface into an input region. Arrangements in which the boundaries of an input region are predefined may also be used.

If desired, haptic output (e.g., a click) can be provided as the user provides track pad input to a surface or to the air. For example, haptic output detents (vibrations that are supplied when the user's finger position coincides with predetermined locations) may be supplied during user finger interactions to indicate the selection of an item, to simulate clicking, and/or to provide other output.

FIG. 11 is another example showing how device 10 may be used to turn an object into an input device. In the example of FIG. 11, object 80 may be a pen or pencil that does not contain any circuitry. A user wearing one or more finger devices 10 may rotate object 80 about its longitudinal axis, may move the tip of object 80 across a surface (e.g., the surface of structure 50), and/or may tap or press the tip of object 80 on the surface of structure 50, and/or may make other movements of object 80. During movement of object 80, one or more finger devices 10 can gather information on the interactions between finger device 10 and object 80 and can thereby be used in determining the location, orientation, and movement of object 80. If desired, device 10 may be used to detect movement of object 80 relative to the surface of structure 50 (e.g., so that object 80 becomes a stylus and device 10 detects stylus input on structure 50). This in turn may be used to control an electronic device and/or objects on a display (e.g., display 54 of FIG. 8).

Figure 12:
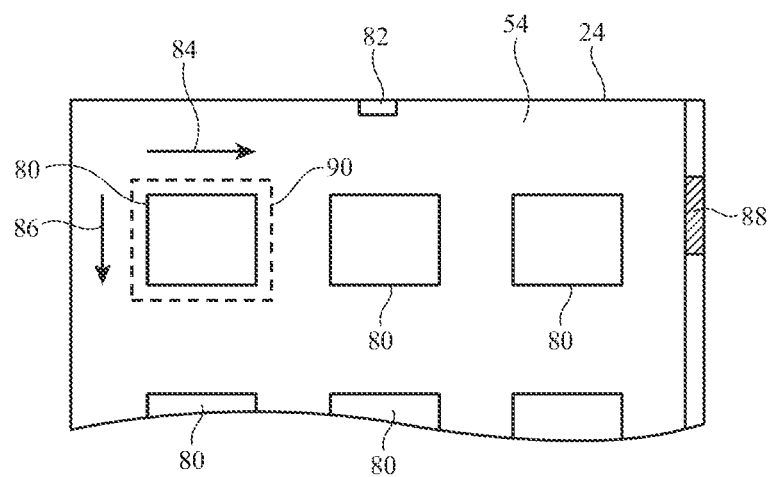
FIGS. 12, 13, and 14 are perspective views of an illustrative electronic device having a display and a finger device being used to provide input to the display in accordance with an embodiment.
Figure 12:
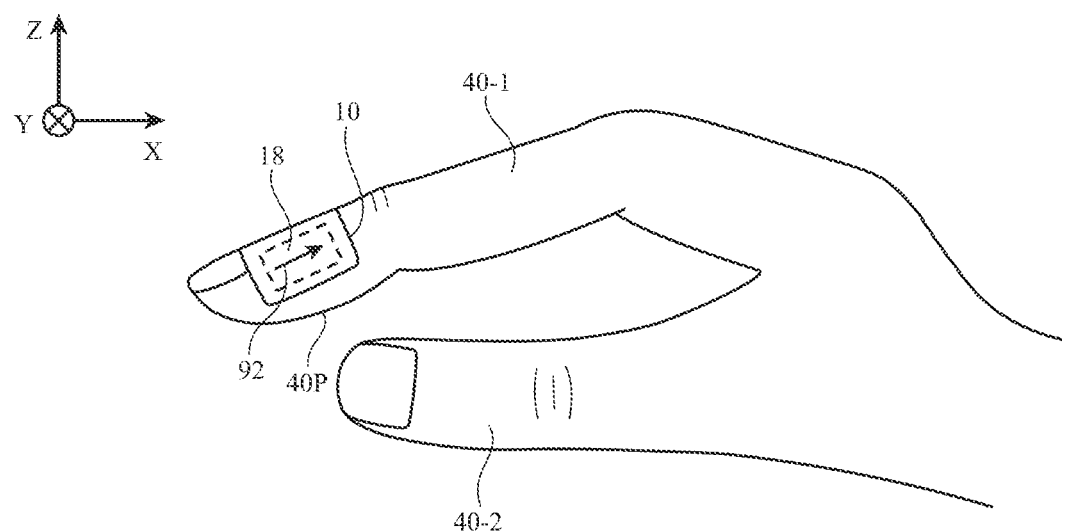

FIG. 12 is a perspective view of an illustrative display and finger device being used to provide input to the display. As shown in FIG. 12, electronic device 24 may include display 54 and an optical sensor such as a gaze detection sensor 82 (sometimes referred to as a gaze detector, gaze tracker, gaze tracking system, or eye monitoring system). Gaze detection sensor 82 may, for example, include image sensors, light sources, and/or other equipment that is used in monitoring the eyes of a user. This system may include one or more visible and/or infrared cameras that face a viewer's eyes and capture images of the viewer's (user's) eyes. The orientation of the user's gaze may be used to determine which location on display 54 the user is looking at (sometimes referred to as the user's point-of-gaze). If desired, device 24 may use gaze tracking information such as information on the user's point-of-gaze in determining which actions to take in system 8. For example, a gaze tracking system may determine that a user's point-of-gaze is directed towards a first object and not a second object and may respond by assuming that the user is visually selecting the first object and not the second object. Finger input and/or other user input may be used in combination with input such as point-of-gaze information in determining which actions are to be taken.

In the example of FIG. 12, display 54 is being used to display image content such as items 80. Items 80 may be a list of menu options, a list of movie options, a channel guide, or any other suitable display content. A user may use finger device 10 to navigate the content being displayed on display 54. For example, display 54 may display a selection indicator such as selection indicator 90 which lets the user know which item 80 is currently selected. The user may move selection indicator 90 to different items 80 by providing input via finger device 10. In the example of FIG. 12, device 10 is worn on finger 40-1 and the user is providing input to device 10 using finger 40-2 (e.g., as described in connection with FIGS. 4 and 6). For example, the user may swipe to the right (e.g., in direction 92) on sensor 18 (e.g., a two-dimensional array of touch sensor electrodes such as electrodes 52 of FIG. 3) to move selection indicator 90 on display 54 to the right (e.g., in direction 84). The user may swipe downward on sensor 18 to move selection indicator 90 on display 54 to downward (e.g., in direction 86). If desired, display 54 may display a visual aid such as scroll bar 88 or other suitable visual aid for indicating where among items 80 the selection indicator 90 is currently located.

If desired, haptic output (e.g., a click) can be provided as the user navigates items 80 on display 54. For example, haptic output detents (vibrations that are supplied when the user's finger position coincides with predetermined locations) may be supplied during user finger interactions to indicate movement of selection indicator 90, to indicate when an item 80 has been selected, and/or to provide other output to the user.

The use of finger 40-2 to provide touch input to the outer surfaces of device 10 (as discussed in connection with FIG. 6) to navigate items on display 54 is merely illustrative. If desired, the user may navigate items on display 54 by using finger 40-2 to provide touch input to the finger pulp of finger 40-1 (as discussed in connection with FIG. 4). In both types of input arrangements, device 10 may be used to detect swipes (e.g., for moving selection indicator 90) and clicks (e.g., hard presses on sensor 18 and/or on pulp 40P) for selecting item 80 on which selection indicator 90 is located. Track pad type input (e.g., of the type described in connection with FIGS. 5, 8, 9, 10, and 11) may also be used to navigate items 80 on display 54. These examples are merely illustrative. Finger device 10 may be used to provide other types of input to display 54.

Figure 13:
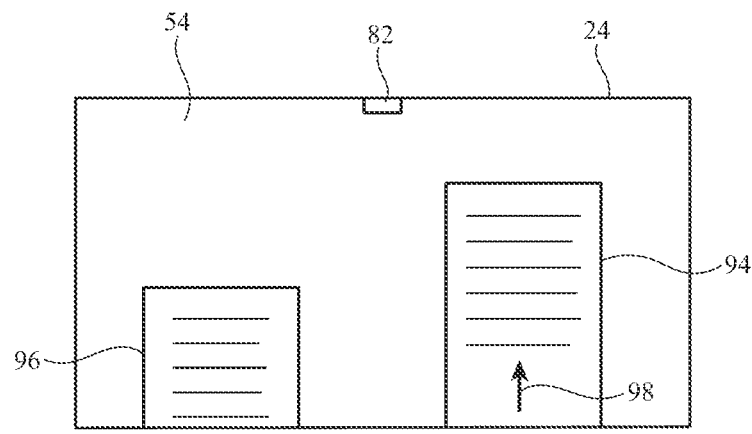
Figure 13:
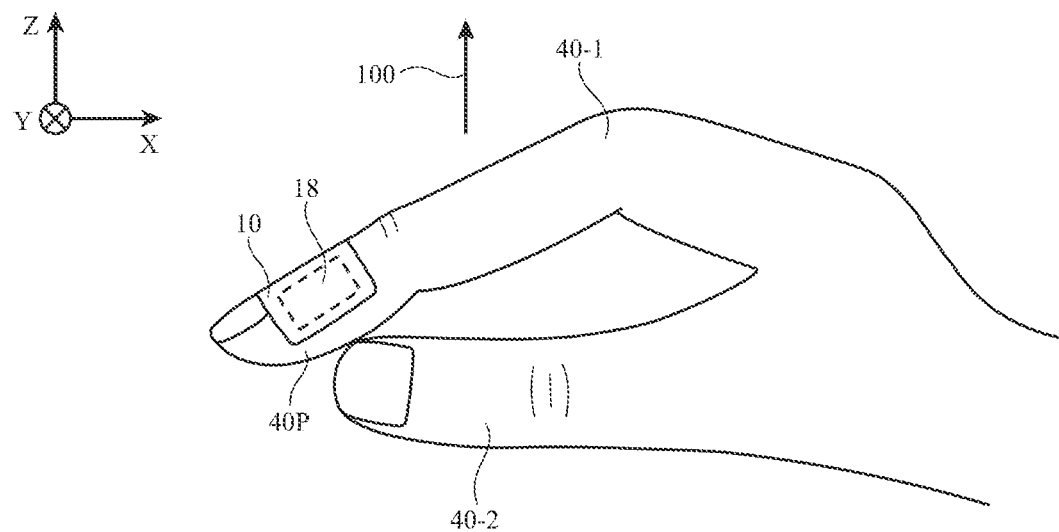

In the example of FIG. 13, display 54 is being used to display image content such as items 96 and 94. Items 96 and 94 may be different documents, tabs, programs, websites, or any other suitable display content. A user may use finger device 10 to navigate the content being displayed on display 54. For example, the user may scroll down on item 94 by pinching his or her finger 40-2 against finger pulp 40P of finger 40-1 wearing device 10 and, while pinching, may pull his or her fingers upward in direction 100. This combination of pinching and pulling upward by the user may in turn cause the bottom of item 94 to move upward in direction 98 by an amount proportional to the upward motion of the user's pinched fingers.

If desired, device 24 may determine which item is being scrolled using the pinch and pull hand gesture using gaze tracker 82. For example, gaze tracker 82 may detect that the user is looking towards the bottom of item 94 during the initial pinching, and control circuitry in device 24 may interpret this gaze information to mean that the pinch and pull upward motion is intended to manipulate item 94 and may move the bottom of item 94 upward in direction 98 accordingly. When the user wishes to manipulate item 96, the user may direct his or her gaze at item 96 (which may be detected by gaze tracker 82) and may make hand or finger gestures with device 10.

If desired, haptic output (e.g., a click) can be provided as items 96 and 94 are manipulated on display 54. For example, haptic output detents (vibrations that are supplied when the user's finger position coincides with predetermined locations) may be supplied during user finger interactions to indicate the selection of an item, to indicate that no further downward scrolling is possible because the end of the item has been reached, and/or to provide other output.

Figure 14:
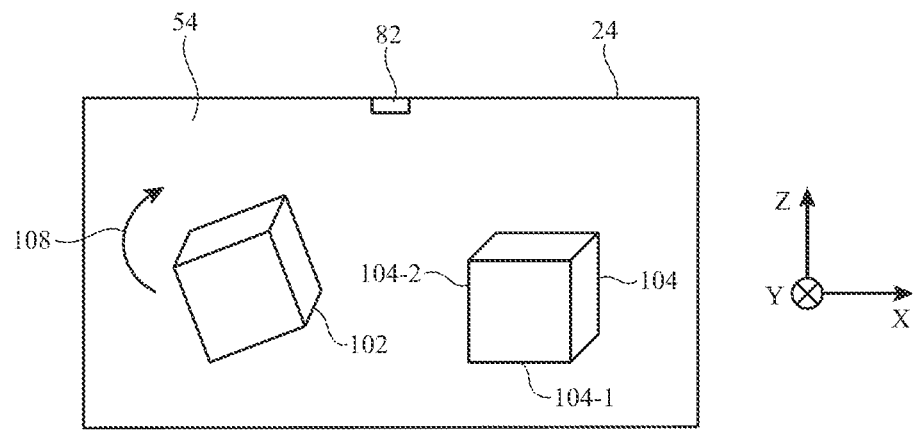
Figure 14:
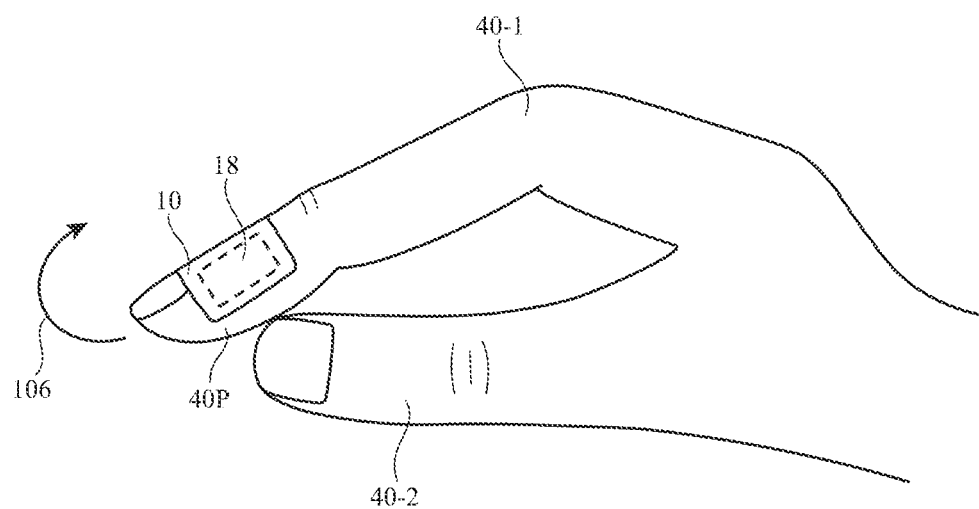

In the example of FIG. 14, display 54 is being used to display image content such as image content associated with a computer-aided design software program. The software program may be used to create two-dimensional and/or three-dimensional illustrations of an engineering project, architectural project, manufacturing project, or other project. In the example of FIG. 14, display 54 is used to display computer-aided design items 102 and 104. A user may use finger device 10 to create and manipulate computer-aided design items 102 and 104. Because finger device 10 detects movement of finger 40 and adjacent fingers in space, finger device 10 may allow for a wider range of user input gestures for manipulating computer-aided designs with six degrees of freedom.

For example, the user may make a pinch gesture to select an item that the user wishes to manipulate. If desired, device 24 may use gaze tracker 82 to determine which item the user is looking at while making the pinch gesture and thus which item the user is selecting. Point-of-gaze information and user input to finger device 10 may also be used to select which axis the user wishes to manipulate in the computer-aided drawings. For example, the user may manipulate axis 104-1 or 104-2 of item 104 on display 54 by pinching fingers 40-1 and 40-2 together (or providing other suitable input with finger device 10) while directing his or her gaze to the desired axis.

Once the displayed item (e.g., item 102, 104, and/or an individual axis of item 102 or item 104) has been selected based on the direction of the user's point-of-gaze (or finger point direction input) and based on the pinch gesture input or other user input with device 10, further user input gathered with one or more devices 10 may be used to rotate and/or otherwise manipulate the selected item. Information on finger movement (e.g., rotational movement) may be gathered using an internal measurement unit or other sensor 18 in device(s) 10 and this rotational input used to rotate the selected object. As shown in FIG. 14, for example, a user may pinch finger pulp 40P of finger 40-1 with finger 40-2 while rotating fingers 40-1 and 40-2 in direction 106, which in turn may be used to rotate item 102 in direction 108.

Display 24 may provide visual aids to let the user know which item or axis is being manipulated. Different types of input to device 10 may be used to make fine control adjustments and course control adjustments, if desired. For example, a finger pinch of the type shown in FIG. 4 may be used to make fine control adjustments and touch input to the outer surface of device 10 as shown in FIG. 6 may be used to make course control adjustments, if desired.

If desired, haptic output (e.g., a click) can be provided as items 102 and 104 are manipulated on display 54. For example, haptic output detents (vibrations that are supplied when the user's finger position coincides with predetermined locations) may be supplied during user finger interactions to indicate the selection of an item, to indicate the locking of a rotational axis, to indicate object-to-object collision, etc.

As described above, one aspect of the present technology is the gathering and use of information such as sensor information. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, eyeglasses prescription, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. A system, comprising:
   an electronic device having a display that displays image content and a first sensor that gathers user gaze information;
   a finger device that is worn on a first finger of a user while leaving a finger pad at the tip of the first finger exposed, wherein the finger device comprises:
      first and second side members configured to extend down respective first and second opposing sides of the first finger; and
      a force sensor located in the first side member and configured to detect a force with which the first finger is compressed; and
   control circuitry configured to:
      use the force sensor to detect finger input from a second finger contacting the finger pad of the first finger; and
      manipulate the image content based on the user gaze information and the finger input.

2. The system defined in claim 1 wherein the finger input comprises a pinch gesture and an upward motion and wherein the control circuitry scrolls the image content downward on the display in response to the pinch gesture and the upward motion.

3. The system defined in claim 2 wherein the force sensor detects movement of a finger pulp portion of the first finger.

4. The system defined in claim 1 wherein the finger device comprises a capacitive touch sensor, wherein the capacitive touch sensor is configured to detect a swipe right on the capacitive touch sensor, and wherein the control circuitry moves a selection indicator on the display to the right in response to the swipe right on the touch sensor.

5. The system defined in claim 1 wherein the finger device comprises a haptic output device that provides haptic output in response to the finger input.

6. A system, comprising:
   an electronic device having a display that displays computer-aided designs and a first sensor that gathers user gaze information;
   a finger device that is worn on a finger of a user, wherein the finger device comprises:
      first and second side members configured to extend down respective first and second opposing sides of the finger; and
      a distance sensor located in the first side member facing the first side of the finger, wherein the distance sensor is configured to measure changes in distance between the first side of the finger and the distance sensor as the finger pad is compressed; and
   control circuitry configured to manipulate the computer-aided designs based on the changes in distance and the user gaze information.

7. The system defined in claim 6 wherein the control circuitry uses the user gaze information to determine whether the user is looking at a first axis or a second axis associated with the computer-aided designs and wherein the control circuitry manipulates the computer-aided designs based on whether the user is looking at the first axis or the second axis.

8. The system defined in claim 6 further comprising a motion sensor that detects rotation of the finger, wherein the control circuitry rotates an element associated with the computer-aided designs in response to the rotation of the finger.

9. The system defined in claim 6 wherein the finger device comprises a haptic output device that provides haptic detent output as the control circuitry manipulates the computer-aided designs.

* * * * *